United States Patent [19]

Hidaka

[11] Patent Number: 5,179,719
[45] Date of Patent: Jan. 12, 1993

[54] PROGRAMMABLE SIGNAL RECEPTION SYSTEM

[75] Inventor: Hidenori Hidaka, Tokyo, Japan

[73] Assignee: Pioneer Electronic Corporation, Tokyo, Japan

[21] Appl. No.: 803,781

[22] Filed: Dec. 6, 1991

Related U.S. Application Data

[63] Continuation of Ser. No. 450,881, Dec. 14, 1989, abandoned.

[30] Foreign Application Priority Data

May 11, 1989 [JP] Japan .................................. 1-116184

[51] Int. Cl.⁵ .............................................. H04H 1/00
[52] U.S. Cl. ..................................... 455/4.1; 455/6.3; 455/140; 455/149; 381/24
[58] Field of Search .......................................... 455/3-4, 455/6, 49, 55, 57, 66, 182, 184, 186, 136, 140, 149, 352, 353, 355, 132; 381/24, 79, 81, 85, 90, 205; 358/86

[56] References Cited

U.S. PATENT DOCUMENTS

| | | | |
|---|---|---|---|
| 2,798,151 | 7/1957 | Fletcher et al. | 455/149 |
| 3,374,315 | 3/1968 | Gladwin, Jr. | 381/81 |
| 4,509,211 | 4/1985 | Robbins | 359/146 |
| 4,542,533 | 9/1985 | Parker | 455/183 |

OTHER PUBLICATIONS

Lafayette Radio Electronics Catalog, 1973, pp. 298-299, Catalog #730.

*Primary Examiner*—Reinhard J. Eisenzopf
*Assistant Examiner*—Andrew Faile
*Attorney, Agent, or Firm*—Sughrue, Mion, Zinn, Macpeak & Seas

[57] ABSTRACT

Carrier frequencies different in frequency from each other are modulated with broadcast signals different from each other, and the thus modulated signals are transmitted through a single transmission line and are suited for reception and demodulation. A programming circuit allows programming of a plurality of different programs, with each program being able to be programmed to activate any selected receivers of a plurality of receivers, and to tune each of the selected receivers to any selected carrier frequency. The different programs are stored in a memory, and each of the receivers is connected to a speaker. A selection circuit allows a user to select any one of the different programs to output the broadcast signals at selected frequencies from selected speakers.

6 Claims, 6 Drawing Sheets

CARRIERS HAVING FREQUENCIES f

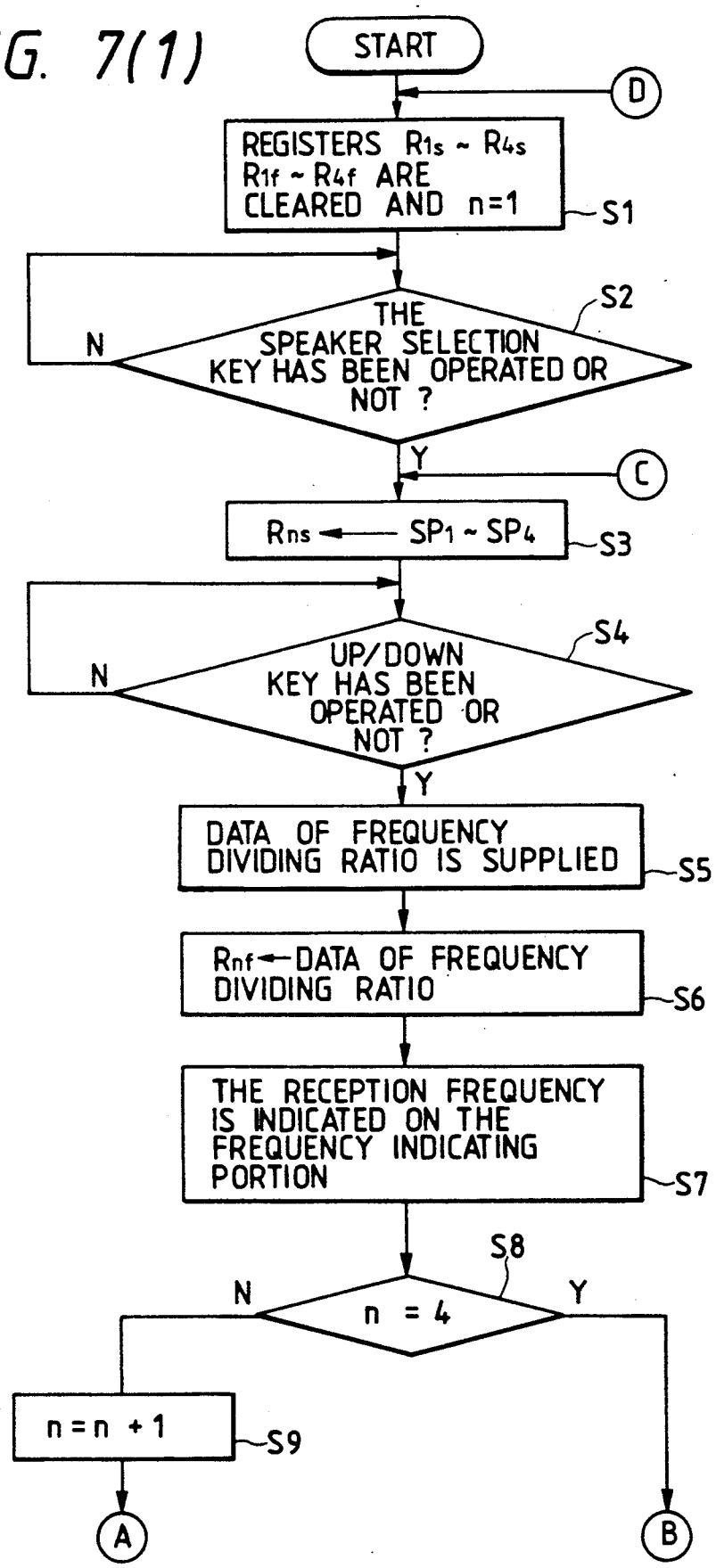

PROGRAMMABLE SIGNAL RECEPTION SYSTEM

This is a continuation of application Ser. No. 07/450,881 filed Dec. 14, 1989. Abandoned.

BACKGROUND OF THE INVENTION

1. Field of the Invention

The present invention generally relates to a programmable broadcast signal reception system, and particularly relates to a broadcast signal reception system for receiving a plurality of broadcast modulated signals transmitted through a single transmission line.

2. Background Art

Recently a home bus system (hereinafter simply abbreviated to "HBS") is about to be put into practice. The HBS is a system in which carrier signals different in frequency from each other are modulated with control signals, and the thus obtained modulated signals are transmitted through a single transmission line and supplied to controlled appliances such as lighting fixtures or the like provided inside a home. The received modulated signals are used to control the controlled appliances on the basis of the control signals obtained by demodulating the modulated signals.

SUMMARY OF THE INVENTION

It is an object of the present invention to provide a novel broadcast signal reception system for receiving a plurality of broadcast signals transmitted through a single transmission line.

In order to attain the above object, according to the present invention the broadcast signal reception system in which carrier signals different in frequency from each other are modulated with broadcast signals different from each other, and the thus obtained modulated signals are transmitted through a single transmission line and are demodulated to thereby receive the broadcast signals. The inventive system comprises: a plurality of receivers having variable tuning frequencies respectively for demodulating the modulated signals to thereby output the broadcast signals respectively; a plurality of speakers disposed at positions different from each other and connected to the plurality of receivers respectively so as to radiate the broadcast signals; and a control means for controlling the plurality of receivers to tune their tuning frequencies to the carrier frequencies respectively.

DETAILED DESCRIPTION OF THE PREFERRED EMBODIMENTS OF THE PRESENT INVENTION

First, referring to FIG. 1, the basic configuration of the broadcast signal reception system according to the present invention will be described.

Figure 1:
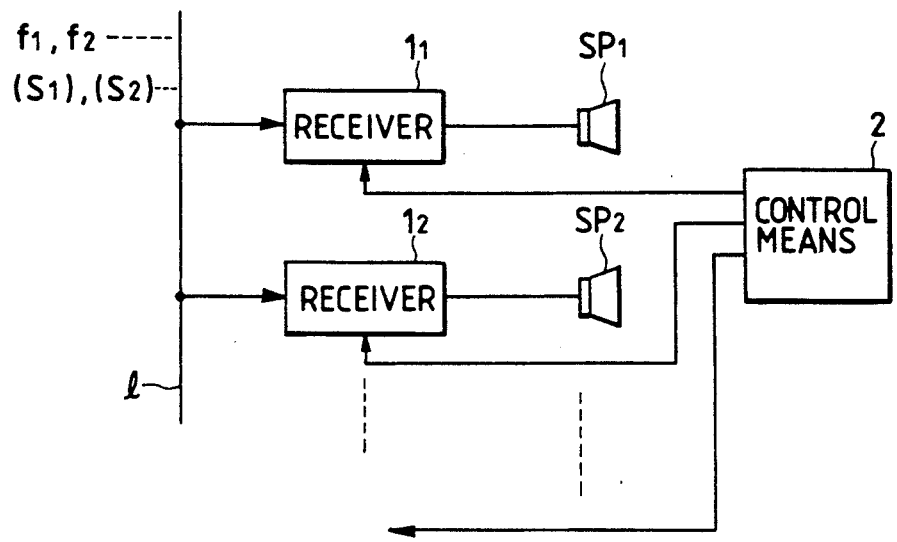
FIG. 1 is a block diagram showing the basic configuration of the broadcast signal reception system according to the present invention.

As shown in FIG. 1, the broadcast signal reception system is arranged to receive broadcast signals $S_1$, $S_2$, ..., different from each other by demodulating modulated signals which were originally formed by modulating carriers $f_1$, $f_2$ ..., different in frequency from each other with the broadcast signals $S_1$, $S_2$, ..., respectively, and which are transmitted through a single transmission line 1. The broadcast signal reception system is constituted by a plurality of receivers $l_1$, $l_2$, ..., a plurality of speakers $SP_1$, $SP_2$, ..., and a control means 2. Each of the receivers $l_1$, $l_2$, ..., has a variable tuning frequency and the receivers demodulate the transmitted modulated signals to thereby output the broadcast signals $S_1$, $S_2$, ..., respectively. The speakers $SP_1$, $SP_2$, ..., are disposed at positions different from each other and connected to the receivers $l_1$, $l_2$, ..., respectively so as to radiate the broadcast signals $S_1$, $S_2$, ..., respectively. The control means 2 controls the receivers $l_1$, $l_2$, ..., so as to tune the tuning frequency thereof to the predetermined carrier frequencies $f_1$, $f_2$, ..., respectively.

In such a configuration, the control means 2 controls the plurality of receivers $l_1$, $l_2$, ..., so that the receivers are tuned to the predetermined carrier frequencies $f_1$, $f_2$, ..., transmitted through the transmission line 1. As a result the respective receivers $l_1$, $l_2$, ..., can demodulate the modulated signals at carrier frequencies $f_1$, $f_2$ ..., different from each other thereby to receive the broadcast signals $S_1$, $S_2$, ..., different from each other, respectively, which are then radiated through the speakers $SP_1$, $SP_2$, ..., which are connected to the receivers, respectively, and disposed at positions different from each other.

Therefore, in the case where the broadcast signals are right and left stereo signals for example the stereo signals can be reproduced through predetermined ones of the speakers under the control of the control means.

Next, referring to FIG. 2 et seq., a preferred embodiment of the present invention will be described hereunder.

Figure 2:
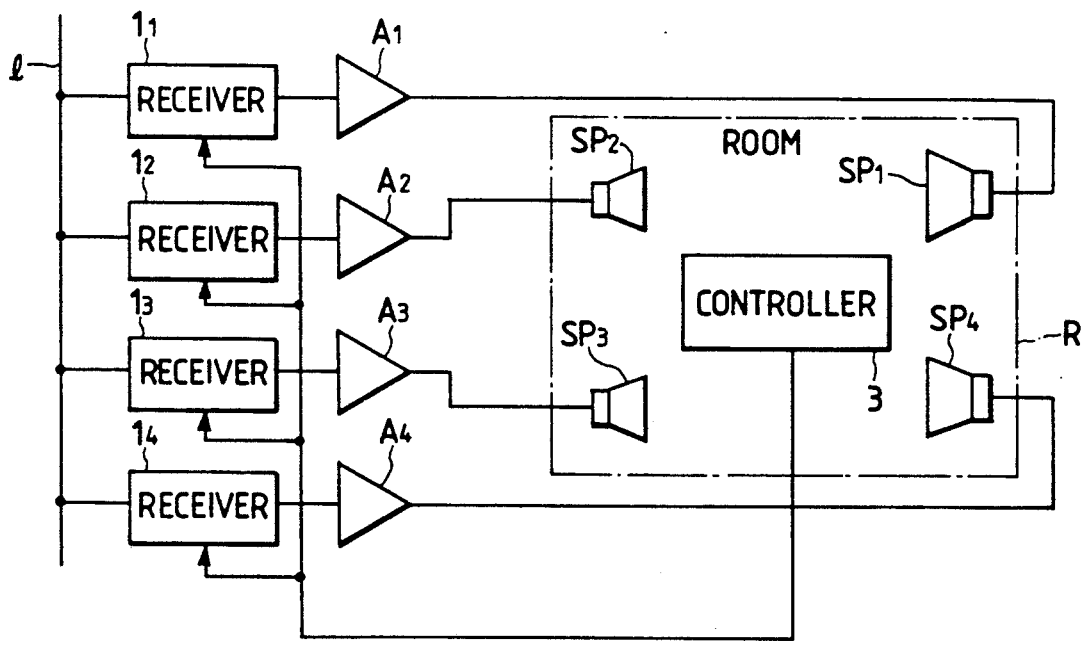
FIG. 2 is a diagram showing an embodiment of the broadcast signal reception system according to the present invention.

FIG. 2 shows an embodiment of the broadcast signal reception system according to the present invention. In the drawing, broadcast modulated signals are transmitted through a single coaxial cable 1 and received by first through fourth receivers $l_1$ through $l_4$. The respective broadcast signals put out from the receivers $l_1$ through $l_4$ are amplified by amplifiers $A_1$ through $A_4$. and then transferred to speakers $SP_1$ through $SP_4$, respectively. The speakers $SP_1$ through $SP_4$ are disposed at four corners of a room R, respectively. Further in the room R, a controller 3 is movably disposed so as to control the tuning frequencies of the respective receivers $l_1$ through $l_4$.

Figure 3:
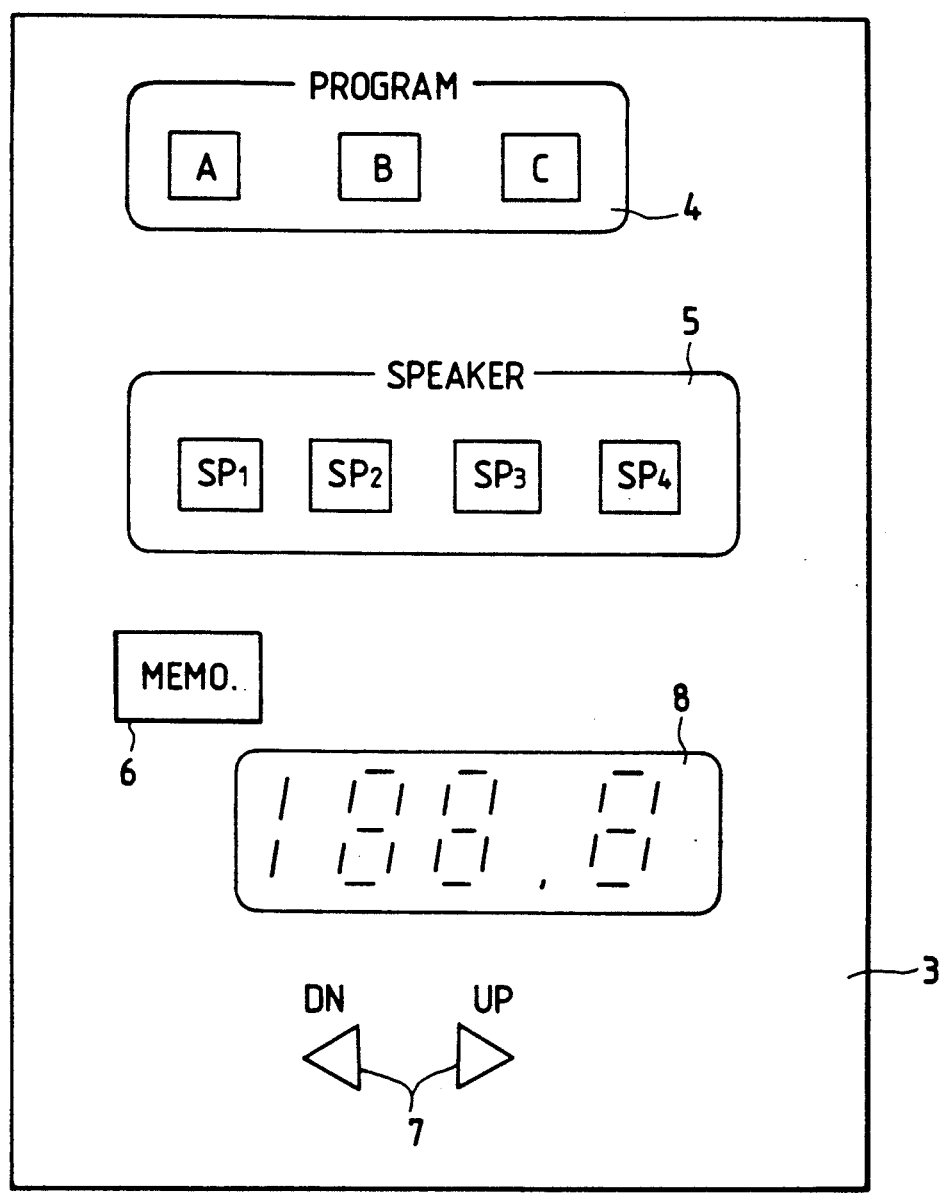
FIG. 3 is a plan view showing the operation part of the controller of FIG. 2.
Figure 4:
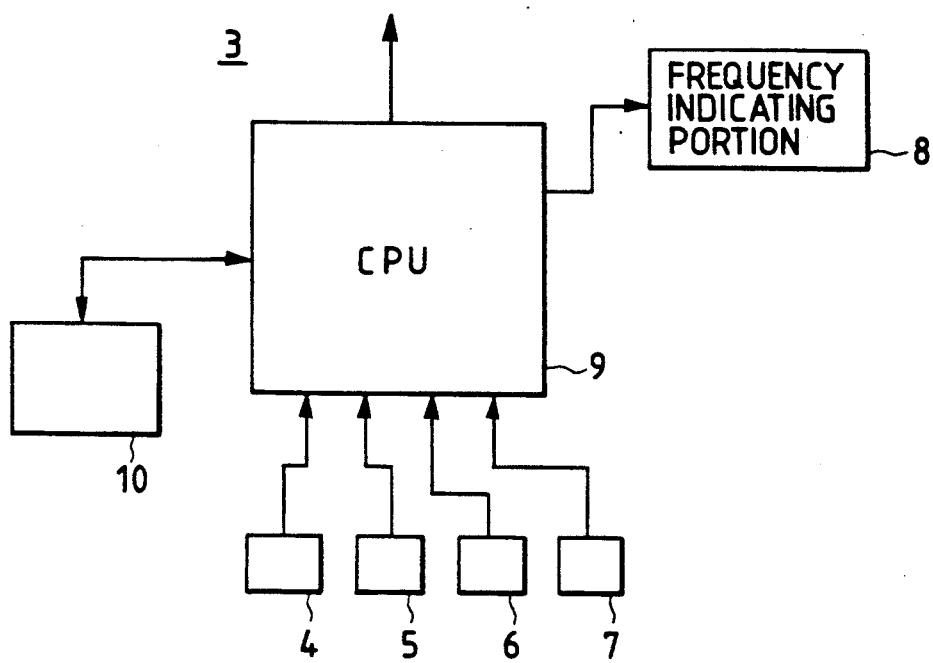
FIG. 4 is a block diagram showing an operational flow arrangement of the configuration of the controller of FIG. 2.
Figure 5:
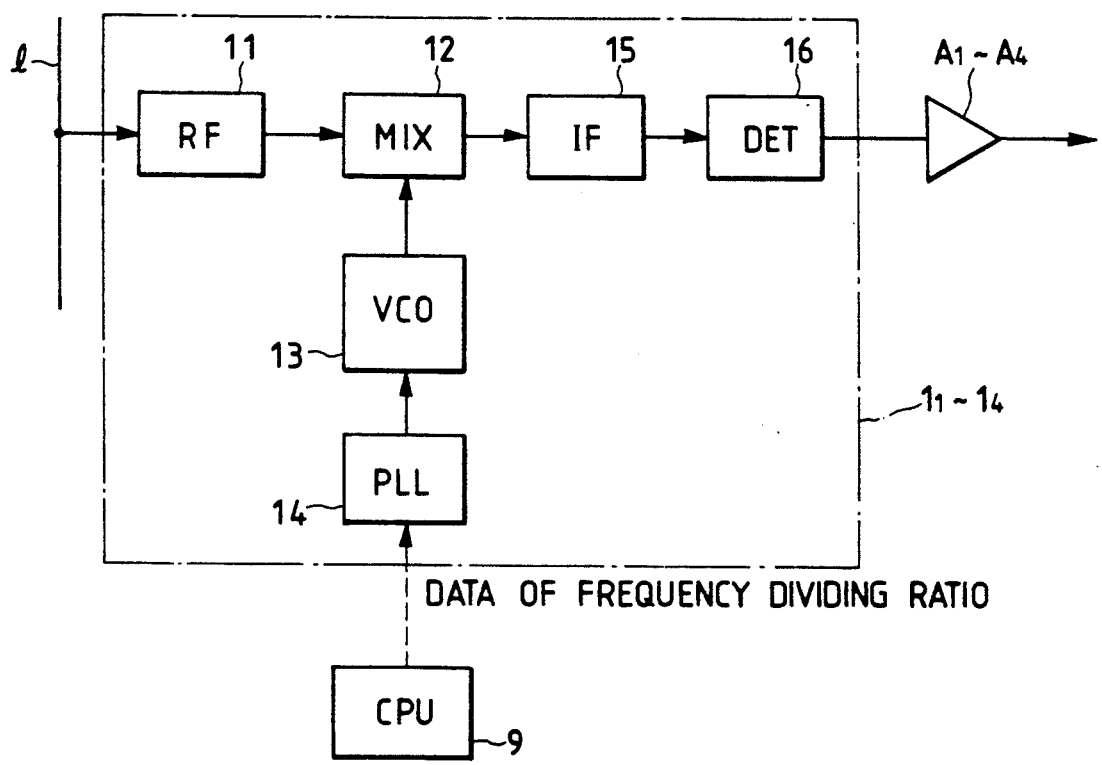
FIG. 5 is a block diagram showing an example of the configuration of the receiver of FIG. 2.

As shown in FIG. 3, the controller 3 is provided on its operation surface with program setting key 4 including key portions "A" through "C", a speaker selection key 5 including key portions "$SP_1$" through "$SP_4$", a memory key 6 a frequency up/down key 7, and a frequency indicating portion 8. The controller 3 further includes a CPU 9 in the inside thereof as shown in FIG. 4. The CPU 9 is connected to a memory 10 and the keys 4 through 7 so as to receive operation data entered through the keys 4 through 7, and to supply data of a frequency dividing ratio to each of the receivers $l_1$ through $l_4$. Further, the CPU 9 makes the frequency indicating portion 8 indicate a reception frequency (carrier frequency) corresponding to the data of frequency dividing ratio Each of the receivers $l_1$ through $l_4$ may be a well known PLL frequency synthesizer receiver which is constituted, as shown in FIG. 5, by an RF amplifier (Radio Frequency) amplifier 11, a mixer 12, a VCO (Voltage Controlled Oscillator) 13, a PLL (Phase Locked Loop) circuit 14, an IF (Intermediate Frequency) amplifier 15, and a detector circuit 16. The data of the frequency dividing ratio is supplied from the CPU 9 to a programmable counter (not shown) of the PLL circuit 14.

Figure 6:
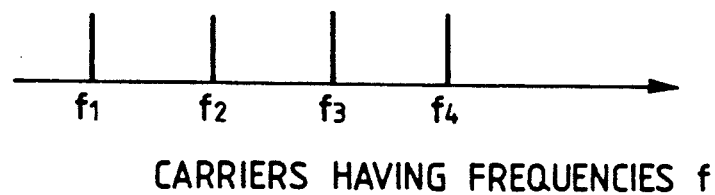
FIG. 6 is a diagram showing the frequencies of carrier signals transmitted through the coaxial cable of FIG. 2.

Signals transmitted through the coaxial cable 1 are, for example, carriers having frequencies $f_1$ through $f_4$ different from each other as shown in FIG. 6, and which are modulated with audio sources such as, for example, right and left two-channel stereo signals $S1_L$, $S1_R$, $S2_L$, and $S2_R$, four-channel signals $S3_{Lfront}$, $S3_{Rfront}$, $S3_{Lrear}$, and $S3_{Rrear}$, or the like. as shown in the following Table 1.

TABLE I

| broadcast example | $f_1$ | $f_2$ | $f_3$ | $f_4$ |
|---|---|---|---|---|
| (1) | $S1_L$ | $S1_R$ | $S2_L$ | $S3_R$ |
| (2) | $S3_{Lfront}$ | $S3_{Rfront}$ | $S3_{Lrear}$ | $S3_{R\ rear}$ |

In Table I, "S1", "S2", and "S3" represent audio sources (musical sources) different from each other, and "L" and "R" in the broadcast example (1) represent right and left channels of a two-channel stereo signal respectively. Further, "front" and "rear" in the broadcast example (2) represent front and rear portions of a four-channel signal respectively.

Referring to the flowchart of FIG. 7, description will be made as to the setting operation to be executed by the CPU in the above configuration.

First, registers $R_{1s}$ through $R_{4s}$ and $R_{1f}$ through $R_{4f}$ are cleared and $n=1$ is set in the step S1. Next, judgment is made as to whether the speaker selection key 5 has been operated or not, in the step S2. If the judgment indicates "YES", the process is shifted to the step S3 in which data concerning the selected one of the speakers $SP_1$ through $SP_4$ is stored in the register $R_{ns}$. Next, the process is shifted to the step S4 in which judgment is made as to whether the frequency up/down key 7 has been operated or not. If the judgment indicates "YES", the process is shifted to the step S5 in which data of frequency dividing ratio corresponding to the operation of the up/down key 7 is supplied to a selected one of the receivers $l_1$ through $l_4$ which is connected to the selected one of the speakers $SP_1$ through $SP_4$ corresponding to the operated speaker selection key 5 set in the step S3. As a result, the data of a frequency dividing ratio is set in the PLL circuit to the selected receiver so that a local oscillation signal produced from the VCO 13 is changed so as to tune the frequency of the selected receiver to a selected one of the carrier frequencies $f_1$ through $f_4$ shown in Table I.

Next, the data of a frequency dividing ratio is stored in the register $R_{nf}$ in the step S6, and the reception frequency corresponding to the data of frequency dividing ratio is indicated on the frequency indicating portion 8 in the step S7. Next, the process is shifted to the step S8 in which judgment is made as to whether $n=4$ or not. If the judgment indicates "NO", "1" is added to the value n in the step S9. and judgment is made as to whether the speaker selection key 5 or the program key 4 has been operated or not in the step S10. The process is returned to the step S3 if the judgment proves that the speaker selection key 5 has been operated, while the process is shifted to the step S12 if the judgment proves that the program key 4 has been operated If the judgment proves that $n=4$ in the step S8, on the contrary, the process is shifted to the step S11 in which judgment is made as to whether the program key 4 has been operated or not. If the judgment indicates "YES", the process is shifted to the step S12 in which judgment is made as to whether the memory key 6 has been operated within a predetermined period of time or not. If the judgment indicates "NO", the process is returned to the step S1. If the judgment indicates "YES", on the contrary, the process is shifted to the step S13 in which the program key 4 operated in the step S10 or S11 and the data of the registers $R_{1s}$ through $R_{ns}$ and $R_{1f}$ through $R_{nf}$ set in the steps S2 through S6 prior to the operation of the program key 4 are stored in the memory 10.

In the foregoing task, a musical source to be received and the operation of the speakers for radiating the musical source have been set. Then, if the program key 4 is operated after the above setting data of the registers $R_{1s}$ through $R_{ns}$ and $R_{1f}$ through $R_{nf}$ corresponding to the operation of the program key 4 are read from the memory 10. The CPU 9 sets data of a frequency dividing ratio on the basis of the read-out data from the resisters $R_{1f}$ through $R_{nf}$, and, on the basis of the data of the registers $R_{1s}$ through $R_{ns}$, selects the PLL circuit 14 of one of the receivers $l_1$ through $l_4$ to which the data of frequency dividing ratio is to be supplied. As a result, it is possible to receive a setting signal having a frequency set on the basis of the frequency dividing ratio data set by the program key 4 from the receiver connected to one of the speakers $SP_1$ through $SP_4$ set by the program key 4.

Next, a specific example of operation will be described. Assume that, for example, the signals of the broadcast example (1) in Table I are transmitted through the coaxial cable 1. First, a user operates the key portion "$SP_2$" of the speaker selection key 5 of the controller 3, and then operates the frequency up/down key 7 so as to select the frequency $f_1$. Next, the user operates the key portion "$SP_3$" of the speaker selection key 5, and operates the frequency up/down key 7 so as to select the frequency $f_2$. Then, the user operates the key portion "A" of the program key 4, and operates the memory key 6 within a predetermined period of time. As a result, the combinations of the speaker "$SP_2$" and frequency "$f_1$" and the speaker "$SP_3$" and frequency "$f_2$" are set in the key portion "A" of the program key 4.

Therefore, if the key portion "A" of the program key 4 is operated again thereafter, the controller 3 controls the receivers $l_2$ and $l_3$ so that the receiver $l_2$ receives the broadcast signal $S1_L$ of the frequency $f_1$ and the receiver $l_3$ receives the broadcast signal $S1_R$ of the frequency $f_2$. As a result, a user can listen to the stereo broadcast signals $S1_L$ and $S1_R$ from the speakers disposed at the left side of the room R of FIG. 2.

Similarly to the above example, the user may listen to the stereo broadcast signals $S2_L$ and $S2_R$ or the 4-channel signals from desired ones of the speakers $SP_1$ through SP$_4$ by repeatedly setting the speaker and the reception frequency in the program key 4.

Since combinations of desired broadcast signals and speakers can be programmed as described above it is not necessary for a user to tune the receivers l$_1$ through l$_4$ individually, but the user can listen to desired broadcast signals from desired speakers SP$_1$ through SP$_4$ corresponding to the user s listening position by operating the program key 4.

Figure 7:
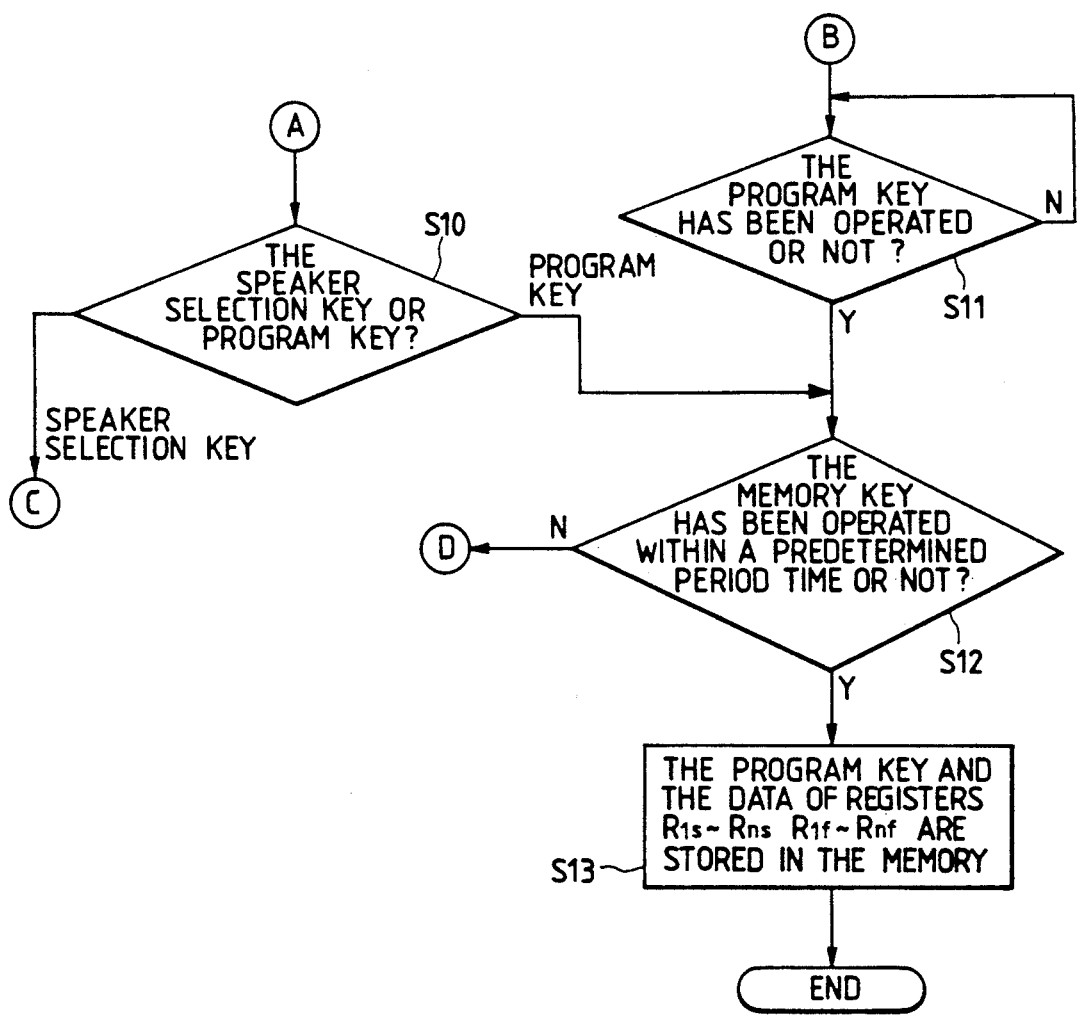
FIG. 7 is a flowchart for explaining the task to be executed by the CPU of FIG. 4.

Further, the process of setting the speaker and frequency is not limited to the flowchart of FIG. 7, and alternatively the following process may be used. That is first, a desired one key portion of the speaker selection key 5 is operated so as to select one of the speakers SP$_1$ through SP$_4$. Next, the frequency up/down key 7 is operated to set the frequency. Then, the memory key 6 is operated so as to once store the combination of the selected speaker and the set frequency. After the foregoing operation has been repeatedly performed, a desired one key portion of the program key 4, the memory key 6, and the previously operated key portions of the speaker selection key 5 are operated in this order so that data concerning the selected combinations of the speakers and frequencies are stored in the selected key portion of the program key 4.

For example in order to perform setting of the foregoing specific operational example, first, the key portion "SP$_2$" of the speaker selection key 5 is operated, the frequency up/down key 7 is operated to select the frequency f$_1$, and the memory key 6 is operated to store the combination of the "SP$_2$" and frequency "f$_1$". Next, the key portion "SP$_3$" of the speaker selection key 5 is operated, the frequency up/down key 7 is operated to select the frequency f$_2$, and the memory key 6 is operated to store the combination of the speaker "SP$_3$" and frequency "f$_2$". Then, the key portion "A" of the program key 4, the memory key 6, the key portions "SP$_2$" and "SP$_3$" of the speaker selection key 5 are operated in this order so that the combination of the speaker "SP$_2$" and frequency "f$_1$" and the combination of the speaker "SP$_3$" and frequency "f$_2$" are stored in the key portion "A" of the program key 4.

As described above, according to the present invention, broadcast signals transmitted through a single transmission line can be received and the broadcast signals can be received by a combination of desired speakers without performing an operation for selecting the receivers individually.

What is claimed is:

1. A programmable broadcast signal reception system in which a plurality of carrier frequencies different frequency from each other are modulated with broadcast signals different from each other, and the thus obtained modulated signals are transmitted through a single transmission line suitable for reception and demodulation, said broadcast signal reception system comprising:

a plurality of receiver means each having variable tuning frequencies, respectively, for demodulating said modulated signals thereby to output said broadcast signals, respectively;

a plurality of speaker means disposed at different respective positions, with each of said speaker means being connected to a different respective one of said plurality of receiver means, so as to receiver a different demodulated output from said different respective one of said plurality of receiver means and thus each radiate different broadcast signals corresponding thereto; and control means for jointly controlling said plurality of receiver means to tune each of said receiver means to a respective one of said plurality of carrier frequencies, said control means comprising programming means having a plurality of different programs to activate selectively any of said plurality of receiver means, said programming means including selection means for selecting one of said plurality of different programs.

2. A system as claimed in claim 1, wherein in said programming means, each of said programs is able to be programmed to tune each of said selected receiver means to any selected carrier frequency.

3. A system as claimed in claim 2, wherein said programming means comprises memory means for storing said plurality of different programs.

4. A system as claimed in claim 1, wherein said control means outputs data of a frequency dividing ratio for each of said receiver means for control thereof, and each of said plurality of receiver means further comprises:

RF means for receiving said modulated signals from said transmission line and outputting an RF output signal;

PLL means for receiving said data of said frequency dividing ratio from said control means and outputting a PLL output signal;

VCO means for receiving said PLL output signal and outputting a VCO output signal;

mixer means for receiving said RF output signal and said VCO output signal, and outputting a mixer output signal;

IF means for receiving said mixer output signal and outputting an IF output signal; and detector means for receiving said IF output signal and outputting said broadcast signals.

5. A system as claimed in claim 3, wherein said control means outputs data of a frequency dividing ratio for each of said receiver means for control thereof, and each of said plurality of receiver means further comprises:

RF means for receiving said modulated signals from said transmission line and outputting an RF output signal;

PLL means for receiving said data of said frequency dividing ratio from said control means and outputting a PLL output signal;

VCO means for receiving said PLL output signal and outputting a VCO output signal;

mixer means for receiving said RF output signal and said VCO output signal, and outputting a mixer output signal;

IF means for receiving said mixer output signal and outputting an IF output signal; and detector means for receiving said IF output signal and outputting said broadcast signals.

6. A system as claimed in claim 6, wherein said plurality of receiver means includes four receivers and said speaker means includes four speakers, each of said four speakers being connected to a respective one of said four receivers and receiving respective left-front, right-front, left-rear and right-rear broadcast signals therefrom.

* * * * *